US 9,437,560 B2

(12) United States Patent
Park et al.

(10) Patent No.: US 9,437,560 B2
(45) Date of Patent: Sep. 6, 2016

(54) SEMICONDUCTOR DEVICE INCLUDING LANDING PAD

(71) Applicant: SAMSUNG ELECTRONICS CO., LTD., Suwon-si, Gyeonggi-do (KR)

(72) Inventors: Je-min Park, Suwon-si (KR); Yoo-sang Hwang, Suwon-si (KR)

(73) Assignee: Samsung Electronics Co., Ltd., Suwon-Si, Gyeonggi-do (KR)

( * ) Notice: Subject to any disclaimer, the term of this patent is extended or adjusted under 35 U.S.C. 154(b) by 0 days.

(21) Appl. No.: 14/606,245

(22) Filed: Jan. 27, 2015

(65) Prior Publication Data

US 2015/0214291 A1    Jul. 30, 2015

(30) Foreign Application Priority Data

Jan. 28, 2014 (KR) .................. 10-2014-0010886

(51) Int. Cl.
*H01L 23/52* (2006.01)
*H01L 23/00* (2006.01)
*H01L 27/108* (2006.01)

(52) U.S. Cl.
CPC ......... *H01L 24/02* (2013.01); *H01L 27/10814* (2013.01); *H01L 27/10855* (2013.01); *H01L 27/10885* (2013.01); *H01L 2924/15313* (2013.01)

(58) Field of Classification Search
CPC ..................................................... H01L 23/52
USPC .................. 257/334, 503, 629, E29.262
See application file for complete search history.

(56) References Cited

U.S. PATENT DOCUMENTS

| 7,316,952 | B2 | 1/2008 | Lee |
| 7,316,953 | B2 | 1/2008 | Lee |
| 7,429,509 | B2 | 9/2008 | Lee |
| 7,678,689 | B2 | 3/2010 | Kim |
| 8,115,311 | B2 | 2/2012 | Paik |
| 2012/0168899 | A1 | 7/2012 | Kim et al. |
| 2012/0187535 | A1* | 7/2012 | Lee .................. H01L 27/10855 257/532 |
| 2012/0269006 | A1 | 10/2012 | Park |
| 2013/0011989 | A1 | 1/2013 | Park et al. |
| 2013/0292847 | A1* | 11/2013 | Choi ..................... H01L 23/498 257/774 |

FOREIGN PATENT DOCUMENTS

| JP | 2006-344963 | 12/2006 |
| KR | 10-2008-0063891 A | 7/2008 |
| KR | 10-2009-0017856 A | 2/2009 |
| KR | 10-2009-0016156 A | 11/2009 |

* cited by examiner

*Primary Examiner* — Marvin Payen
(74) *Attorney, Agent, or Firm* — Lee & Morse, P.C.

(57) ABSTRACT

A semiconductor device includes conductive lines spaced from a substrate, and an insulating spacer structure between the conductive lines and defining a contact hole. The insulating spacer structure is adjacent a side wall of at least one of the conductive lines. The device also includes an insulating pattern on the conductive lines and insulating spacer structure, and another insulating pattern defining a landing pad hole connected to the contact hole. A contact plug is formed in the contact hole and connects to the active area. A landing pad is formed in the landing pad hole and connects to the contact plug. The landing pad vertically overlaps one of the pair of conductive line structures.

11 Claims, 17 Drawing Sheets

A - A'

B - B'

C-C'

D-D'

C-C'

SEMICONDUCTOR DEVICE INCLUDING LANDING PAD

CROSS-REFERENCE TO RELATED APPLICATIONS

Korean Patent Application No. 10-2014-0010886, filed on Jan. 28, 2014, and entitled, "Semiconductor Device Including Landing Pad," is incorporated by reference herein in its entirety.

BACKGROUND

1. Field

One or more embodiments described herein relate to a semiconductor device.

2. Description of the Related Art

As the degree of integration of a semiconductor device increases, the rules for designing various features of the semiconductor device decrease. In a highly integrated semiconductor device, cross-sectional areas of conductive lines, and a contact plug between the conductive lines, decrease. For example, the lower electrode of a capacitor formed on the contact plug may have a reduced cross-sectional area. When such a lower electrode is connected to an active area of a substrate through the contact plug, the contact area with the plug is limited. As a result, the degree to which contact resistance may be reduced is limited, which adversely affects performance of the semiconductor device.

SUMMARY

In accordance with one embodiment, a semiconductor device includes a substrate that has an active area; a pair of conductive line structures on the substrate and including insulating spacer structures respectively formed on side walls thereof; a contact plug between the pair of conductive line structures and connected to the active area; a first insulating pattern on the pair of conductive line structures; a second insulating pattern to contact a side surface of the first insulating pattern and a top surface of each of the insulating spacer structures; and a landing pad connected to the contact plug, formed between the first insulating pattern and the second insulating pattern, and extending to and over the first insulating pattern to vertically overlap one conductive line structure of the pair of conductive line structures.

The semiconductor device may include a capacitor lower electrode on a top surface of the landing pad to be electrically connected to the landing pad. A top surface of the first insulating pattern may be substantially parallel to a plane that extends from a main surface of the substrate, and a bottom surface of the first insulating pattern covering top surfaces of the insulating spacer structure and the pair of conductive line structures in a direction may be substantially parallel to the plane that extends from the main surface of the substrate.

The contact plug may be between the pair of conductive line structures has a width of a first size in a direction substantially parallel to a plane that extends from a main surface of the substrate; the landing pad may have a width of a second size over the first insulating pattern in the direction parallel to the plane that extends from the main surface of the substrate; and the second size may be greater than the first size.

The semiconductor device may include a metal silicide film between the contact plug and the landing pad. The first insulating pattern and the second insulating pattern may include a same material. The insulating spacer structure may include an air spacer. The semiconductor device may include a barrier film to surround side walls of the first insulating pattern, the second insulating pattern, and the insulating spacer structure.

In accordance with another embodiment, a semiconductor device includes a substrate that has an active area; a pair of conductive line structures on the substrate and including insulating spacer structures respectively formed on side walls thereof; an insulating pattern on the pair of conductive line structures and each of the insulating spacer structures; a contact forming conductive layer connected to the active area and between the pair of conductive line structures; a landing pad forming conductive layer that contacts a top surface of the contact forming conductive layer; and a landing pad connected to a top surface of the landing pad forming conductive layer and vertically overlapping one conductive line structure of the pair of conductive line structures.

Each conductive line structure of the pair of conductive line structures may include an insulating capping line, and a bottom surface of the insulating pattern may cover top surfaces of the insulating spacer structure and the insulating capping line in a direction substantially parallel to a plane that extends from a main surface of the substrate. A height of a surface of the landing pad forming conductive layer that contacts the landing pad may be lower than a height of an uppermost surface of the insulating pattern.

The landing pad forming conductive layer may contact the contact forming conductive layer, and a size of a width between the landing pad forming conductive layer and the contact forming conductive layer in a direction substantially parallel to a plane that extends from a main surface of the substrate may be greater than a size of a width of the contact forming conductive layer between the pair of conductive line structures in the direction substantially parallel to the plane that extends from the main surface of the substrate. The contact forming conductive layer may include a same material as a material of the landing pad forming conductive layer.

The semiconductor device may include a metal silicide film on a bottom surface and a side surface of the landing pad that contact the landing pad forming conductive layer. A barrier film may be on a side wall of the landing pad and a top surface of the metal silicide film.

In accordance with another embodiment, a semiconductor device includes an active area; adjacent conductive lines; an insulating spacer between the conductive lines and defining a contact hole having a first width in a first direction; an insulating pattern on the conductive lines and insulating spacer; a second insulating pattern over the first insulating pattern to define a landing pad hole, the second insulating pattern having a second width different from the first width; a contact plug in the contact hole and connected to the active area; and a landing pad in the landing pad hole and connected to the contact plug, wherein the landing pad or the contact plug at least partially overlaps one of the conductive lines along the first direction. A capacitor electrode may be electrically connected to the landing pad. The second width may be greater than the first width.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
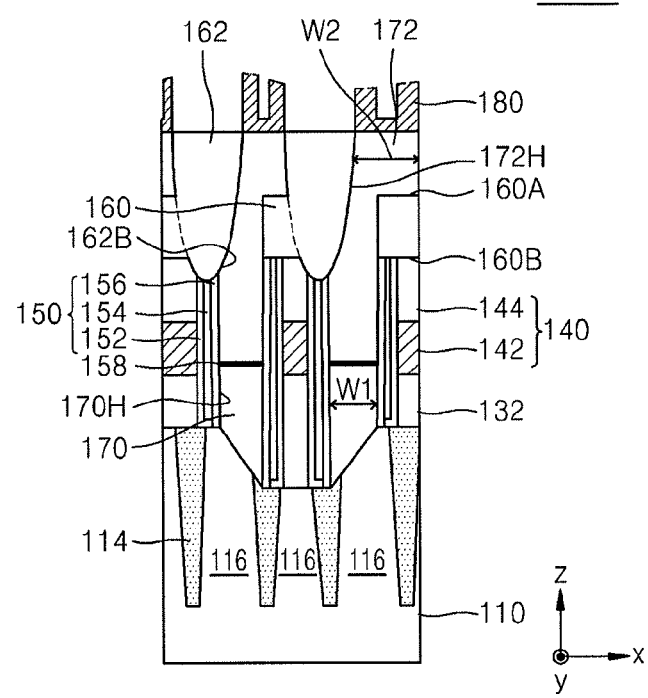
FIG. 1 illustrates an embodiment of a semiconductor device.

Example embodiments are described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

As used herein, the term "and/or" includes any and all combinations of one or more of the associated listed items. Expressions such as "at least one of," when preceding a list of elements, modify the entire list of elements and do not modify the individual elements of the list.

It will be understood that, although the terms first, second, third, etc. may be used herein to describe various members, regions, layers, portions, and/or elements, these members, regions, layers, portions, and/or elements should not be limited by these terms. These terms are only used to distinguish one member, region, portion, or element from another member, region, portion, or element. Thus, a first member, region, portion, or element discussed below could be termed a second member, region, portion, or element without departing from the teachings of exemplary embodiments. For example, a first element could be termed a second element, and, similarly, a second element could be termed a first element, without departing from the scope of exemplary embodiments.

When a certain embodiment may be implemented differently, a specific process order may be performed differently from the described order. For example, two consecutively described processes may be performed substantially at the same time or performed in an order opposite to the described order.

Variations from the shapes of the illustrations as a result, for example, of manufacturing techniques and/or tolerances, are to be expected. Thus, exemplary embodiments should not be construed as limited to the particular shapes of regions illustrated herein but may be to include deviations in shapes that result, for example, from manufacturing.

FIG. 1 illustrates an embodiment of a semiconductor device 100-1 in cross section. Referring to FIG. 1, the semiconductor device 100-1 includes a substrate 110 having an active area 116 defined by a device isolation film 114.

The substrate 110 may include silicon (Si), for example, monocrystalline silicon, polycrystalline silicon, or amorphous silicon. In another embodiment, the substrate 110 includes a semiconductor material such as germanium (Ge), silicon germanium (SiGe), silicon carbide (SiC), gallium arsenide (GaAs), indium arsenide (InAs), or indium phosphide (InP). In another embodiment, the substrate 110 may include a conductive region, for example, a well doped with impurities or a structure doped with impurities.

A plurality of conductive lines 142 are formed over and spaced from the substrate 110, with an intervening insulating pattern 132. The conductive lines 142 may extend over the substrate 110 in one direction (e.g., Y direction) in parallel with one another. In one embodiment, the conductive lines 142 may be bit lines.

The conductive lines 142 are covered by respective insulating capping lines 144. One conductive line 142, and one insulating capping line 144 that covers the one conductive line 142, may be included in one conductive line structure 140. A second insulating pattern 160 is formed on the conductive line structure 140. A top surface 160A and a bottom surface 160B of the second insulating pattern 160 may be formed to be parallel to a main surface of the substrate 110. The plurality of conductive line structures 140 may include insulating spacer structures 150 that are respectively formed on both side walls of the plurality of conductive line structures 140 and cover the both side walls of the plurality of conductive line structures 140.

Each of the insulating spacer structures 150 may include a first insulating spacer 152, a second insulating spacer 154, and a third insulating spacer 156. The second insulating spacer 154 formed between the first insulating spacer 152 and the third insulating spacer 156 may be an air spacer, e.g., one including air. The top of the second insulating spacer 154 may be closed by a bottom surface 162B of a third insulating pattern 162. The tops of the first insulating spacer 152 and the third insulating spacer 156 may contact the bottom surface 162B of the third insulating pattern 162.

A plurality of contact holes 170H pass through the insulating film 132 to expose respective ones of the active areas 116. The contact holes 170H are formed in the insulating film 132. Each contact hole 170H is formed between two adjacent conductive line structures 140 from among the plurality of conductive line structures 140, and is defined by the insulating spacer structure 150 that covers a side wall of each of the two adjacent conductive line structures 140.

The third insulating pattern 162 includes a plurality of landing pad holes 172H that communicate with the contact holes 170H. The third insulating pattern 162 may be formed over the conductive lines 142. The third insulating pattern 162 may be formed to contact a side surface of the second insulating pattern 160. The third insulating pattern 162 may also be formed to contact the top of the insulating spacer structure 150.

Each contact hole 170H may have a width W1 of a first size in a direction parallel to a plane that extends from the main surface of the substrate 110. Each landing pad hole 172H may have a width W2 of a second size in a first direction parallel to the plane that extends from the main surface of the substrate 110 on the top surface 160A of the second insulating pattern 160, e.g., in the X direction. In one embodiment, the width W2 may be greater than the width W1.

A contact plug 170 may be formed between the adjacent ones of the conductive line structures 140, and may be connected to the substrate 110. The contact plug 170 may be formed by filling a contact hole 170H with a conductive material. A metal silicide film 158 may be formed on the contact plug 170. The contact plugs 170 may be respectively connected to the active areas 116 of the substrate 110, and extend in the contact holes 170H in a second direction (e.g., Z direction) perpendicular (or otherwise crossing) to a direction in which the main surface of the substrate 110 extends. Each of the contact plugs 170 may have the width W1 with the first size in the direction parallel to the plane that extends from the main surface of the substrate 110 between two adjacent conductive line structures 140 from among the plurality of conductive line structures 140.

A landing pad 172 may be formed between adjacent insulating spacer structures 150, and may fill the landing pad hole 172H defined by the second insulating pattern 160 and the third insulating pattern 162. The landing pad 172 is formed between the third insulating pattern 162 and the second insulating pattern 160 that is adjacent to the third insulating pattern 162 and does not contact the third insulating pattern 162 and extends to and over the top surface 160A of the second insulating pattern 160 to vertically overlap with one conductive line structure 140 selected from the plurality of conductive line structures 140. The landing pad 172 may be electrically and/or physically connected to the contact plug 170.

The metal silicide film 158 may be formed between the contact plug 170 and the landing pad 172. The metal silicide film 158 may include cobalt silicide ($CoSi_x$), nickel silicide ($NiSi_x$), and/or manganese silicide ($MnSi_x$). For illustrative purposes, the metal silicide film 158 in FIG. 1 may be formed of cobalt silicide ($CoSi_x$).

A capacitor lower electrode 180 may be formed on and in contact with the landing pad 172.

The contact plug 170 may have the width W1, which, for example, corresponds to a horizontal cross-sectional area of the contact hole 170H between adjacent conductive line structures 142. That is, the contact plug 170 may have the width W1 with the first size in the direction parallel to the plane that extends from the main surface of the substrate 110 between two adjacent conductive line structures 140. An upper end portion of the landing pad 172 may have the width W2 over the top surface 160A of the second insulating pattern 160, and may correspond to a horizontal cross-sectional area of the landing pad hole 172H. The width W2 of the second size of the upper end portion of the landing pad 172 may be greater than the width W1 of the contact plug 170 in the X direction.

In the semiconductor device 100-1, the contact plug 170 and the landing pad 172 are connected to the active area 116 in order to electrically connect the active area 116 to the capacitor lower electrode 180. The landing pad 172 is formed to vertically overlap (e.g., at least partially overlap along the first or X direction) one of the conductive line structure 140, and to cover the conductive line structure 140 (e.g., to partially overlap the conductive line structure 140) and the second insulating pattern 160 (e.g., fully overlap in the first or X direction). The landing pad 172 is electrically connected to the contact plug 170. The metal silicide film 158 is formed between the contact plug 170 and the landing pad 172. The capacitor lower electrode 180 is connected to the landing pad 172.

The second insulating pattern 160 may be formed such that the top surface 160A and the bottom surface 160B are parallel to the plane that extends from the main surface of the substrate 110, e.g., extends in the first or X direction. The second insulating pattern 160 covers the insulating capping line 144 of the conductive line structure 140 in the direction parallel to the plane that extends from the main surface of the substrate 110, e.g., in the first or X direction.

Also, the second insulating pattern 160 may be formed such that the bottom surface 162B of the third insulating pattern 162 covers (e.g., partially or completely overlaps in the first or X direction) an upper portion of the insulating spacer structure 150. With this structure, a bridge phenomenon between a plurality of the landing pads 172 may be prevented. Also, when the second insulating spacer 154 of the insulating spacer structure 150 is formed as an air spacer, part of the material deposited to form the landing pad 172 may be prevented from penetrating into the air spacer.

Figure 2:
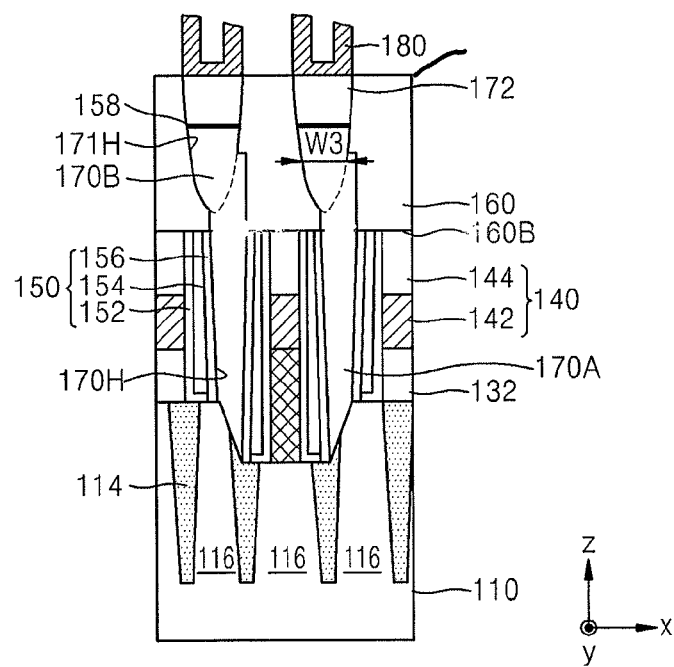
FIG. 2 illustrates another embodiment of a semiconductor device.

FIG. 2 illustrates a second embodiment of a semiconductor device 100-2 which includes the substrate 110, the active area 116, the insulating film 132 formed on the substrate 110, the conductive line structure 140, and the second insulating pattern 160 formed on a top surface of the conductive line structure 140 in the direction parallel to the main surface of the substrate 110. The semiconductor device 100-1 of FIG. 1 and the semiconductor device 100-2 of FIG. 2 are different from each other in a contact landing pad hole 171H and a landing pad forming conductive layer 170B.

The active areas 116 are exposed by the contact holes 170H formed in the insulating film 132. Each contact hole 170H is formed between adjacent conductive line structures 140, defined by the insulating spacer structure 150 that covers a side wall of each of two adjacent conductive line structures 140 and the second insulating pattern 160 formed to contact the insulating spacer structure 150. A contact forming conductive layer 170A is filled in the contact hole 170H, and is connected to the substrate 110. The contact forming conductive layer 170A may be formed between adjacent conductive line structures 140. The contact forming conductive layer 170A may be connected to the active area 116.

The contact landing pad hole 171H is formed over the contact hole 17011 in a space defined by the second insulating pattern 160. The landing pad forming conductive layer 170B is formed to fill a lower portion of the contact landing pad hole 171H. The landing pad forming conductive layer 170B may be electrically connected to the contact forming conductive layer 170A.

The landing pad 172 is formed on the landing pad forming conductive layer 170B. The landing pad 172 may be connected to the landing pad forming conductive layer 170B. The capacitor lower electrode 180 is formed on the landing pad 172 and is connected to the landing pad 172. A height of a surface of the landing pad forming conductive layer 170B that contacts the landing pad 172 may be lower than a height of an uppermost surface of the second insulating pattern 160. The height of the landing pad forming conductive layer 170B that contacts the landing pad 172 will be explained below in detail with reference to FIG. 16.

In FIG. 2, the semiconductor device 100-2 may include the metal silicide film 158 formed between conductive layer 170B and the landing pad 172.

In the semiconductor device 100-2, because the top surface 160A and the bottom surface 160B of the second insulating pattern 160 are horizontal in the direction parallel to the main surface of the substrate 110, a bridge phenomenon between the landing pads 172 may be prevented. Also, a material of the lower capacitor electrode 180 may be prevented from penetrating into the second insulating spacer 154, that is an air spacer.

Also, because the contact forming conductive layer 170A extends to part of the bottom surface 160B of the second insulating pattern 160, and because the landing pad forming conductive layer 170B is connected to an upper portion of the contact forming conductive layer 170A integrated with the upper portion of the contact forming conductive layer 170A, a width W3 sufficient to connect the landing pad 172 may be guaranteed. Accordingly, a sufficient margin of a width of a position where the landing pad 172 is to be formed may be provided during a process of forming the landing pad 172, thereby reducing a failure rate.

Figure 3:
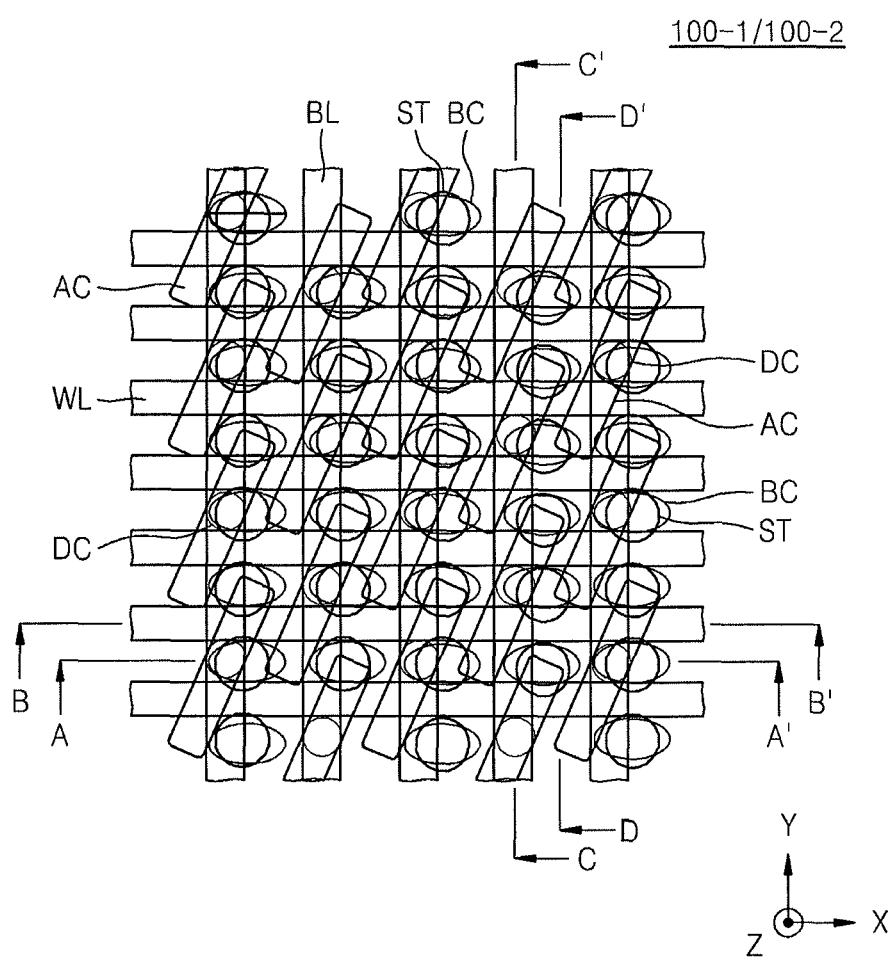
FIG. 3 illustrates an embodiment of a cell array region.

FIG. 3 illustrates a cell array region which may include semiconductor device 100-1 or the semiconductor device 100-2 according to one embodiment. The plan layout of FIG. 3 may be applied to a memory cell having a unit cell size which, for example, is $NF^2$ in a semiconductor memory device, where F is a minimum lithographic feature size and N is a predetermined integer. In one embodiment, $NF^2=6F^2$.

Referring to FIG. 3, the cell array region includes the semiconductor devices 100-1 or 100-2 with active areas AC. The active areas AC correspond to the active areas 116 in semiconductor devices 100-1 and 100-2 in FIGS. 1 and 2. A plurality of word lines WL cross the plurality of active areas AC and are parallel to one another in a first direction (e.g., X direction in FIG. 3). The word lines WL may be arranged at regular intervals and, for example, may correspond to word lines 120 of FIGS. 4B, 4C, and 4D.

A plurality of bit lines BL extend over the word lines WL and are parallel to one another in a second direction (e.g., Y direction in FIG. 3) perpendicular (or otherwise crossing) to the first direction. The bit lines BL are connected to the active areas AC through direct contacts DC. The bit lines BL correspond to the conductive lines 142 in FIGS. 1 and 2.

The bit lines BL may be arranged at a predetermined pitch or interval (e.g., 3F) and are parallel to one another. The word lines WL are arranged at a predetermined pitch or interval (e.g., 2F) and are parallel to one another.

A plurality of buried contacts BC may include a contact structure that extends from a space between adjacent bit lines BL to an upper portion of one of the adjacent bit lines BL. The buried contacts BC may be aligned, for example, in the first direction and the second direction. Also, the buried contacts BC may be arranged, for example, at predetermined (e.g., regular) intervals in the second direction. The buried contacts BC correspond to the contact plugs 170 of FIG. 1 and the contact forming conductive layers 170A of FIG. 2.

The buried contacts BC may function to electrically connect the lower electrode ST of a capacitor to respective ones of the active areas AC. The lower electrode ST of the capacitor corresponds to the lower electrode 180 of the capacitor in FIGS. 1 and 2.

FIGS. 4A through 12D illustrate operations included in an embodiment of a method for manufacturing a semiconductor device. FIGS. 4A through 4E illustrate a common process for manufacturing the semiconductor devices 100-1 and 1002 of FIGS. 1 and 2. FIGS. 5 through 12D illustrate a process of manufacturing the semiconductor device 100-1 of FIG. 1. FIGS. 13 through 17D illustrate a process of manufacturing the semiconductor device 100-2 of FIG. 2. Also, FIGS. 5 through 11, and FIGS. 13 through 16 are cross-sectional views illustrating consecutive manufacturing processes.

Figure 4A:
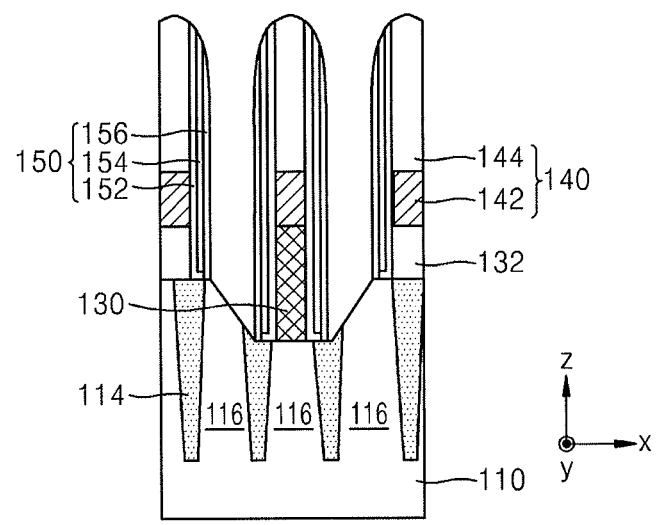
FIGS. 4A through 12D illustrate an embodiment of a method for manufacturing the semiconductor device of FIG. 1.
Figure 4B:
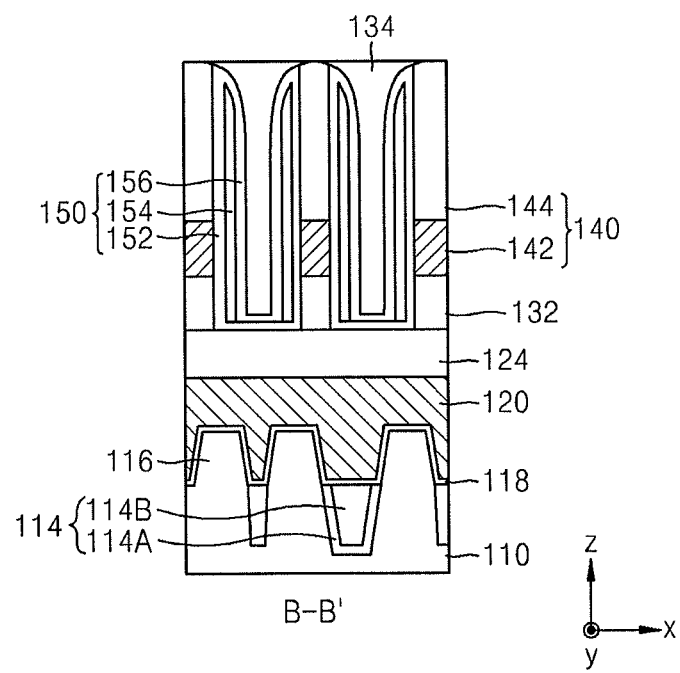
Figure 4C:
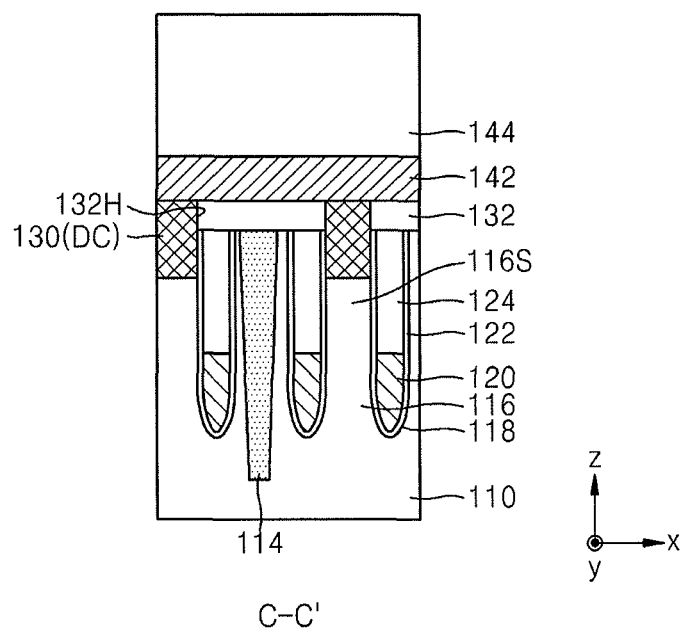
Figure 4D:
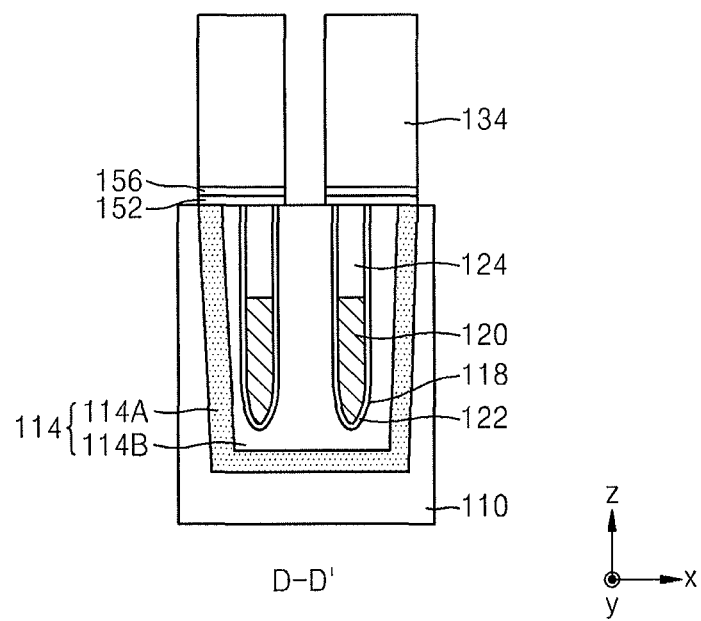
Figure 12A:
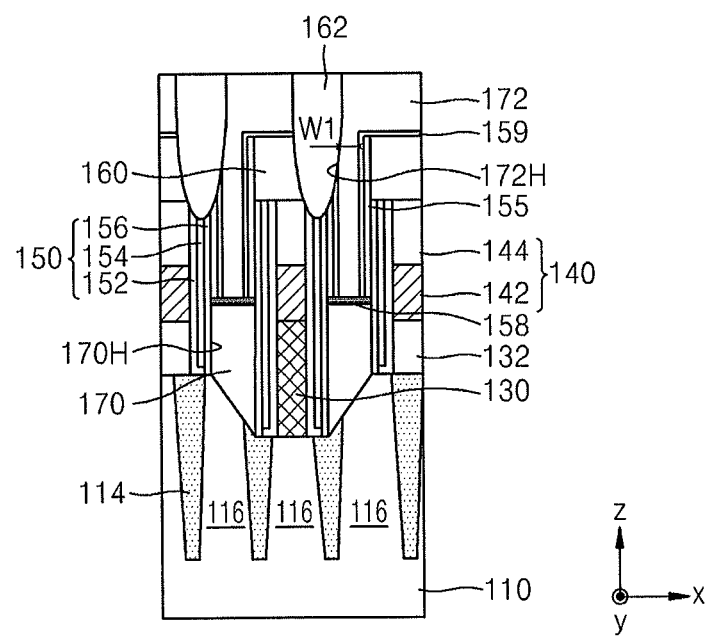
Figure 12B:
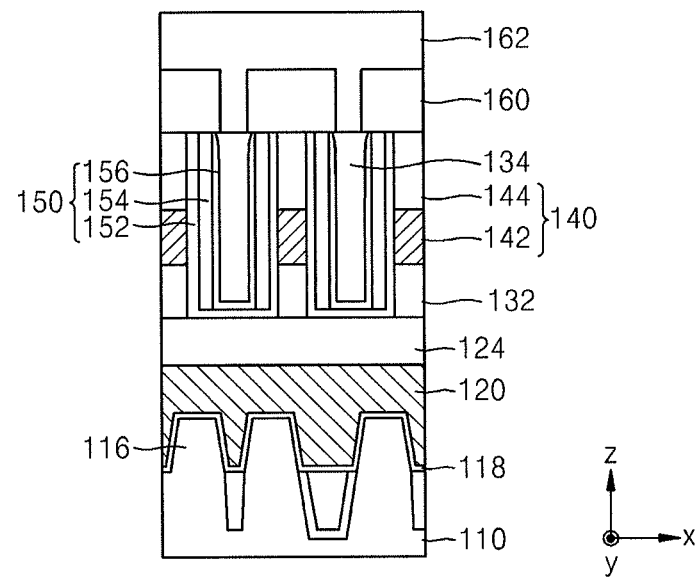
Figure 12C:
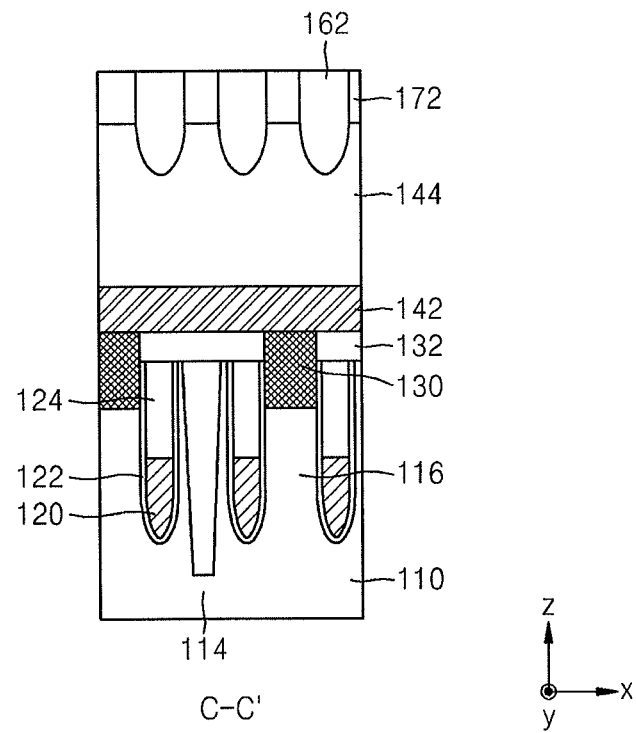
Figure 12D:
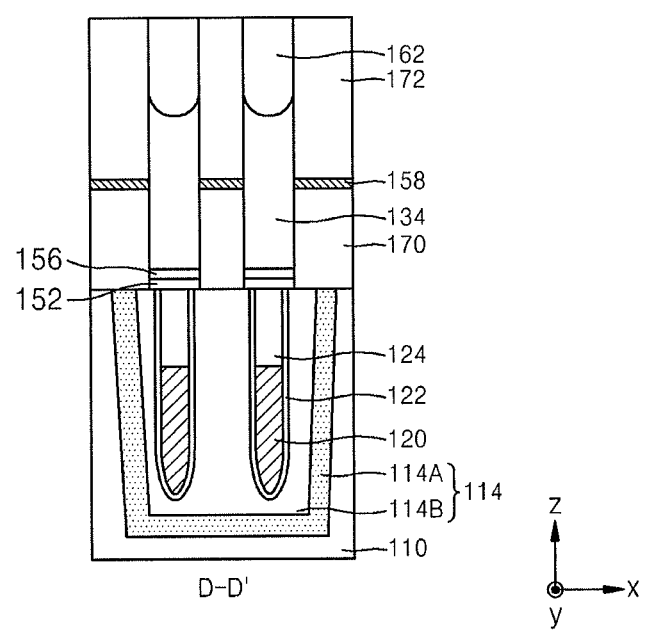
Figure 17A:
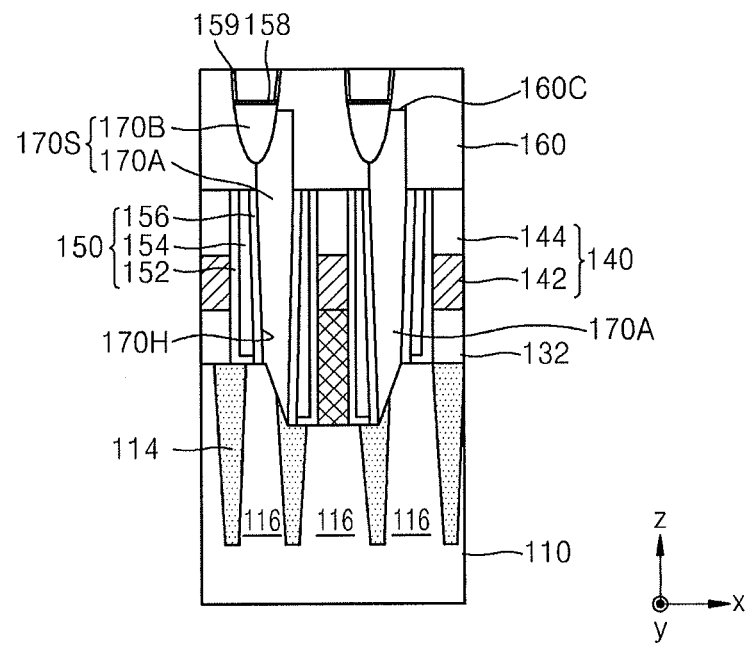
Figure 17B:
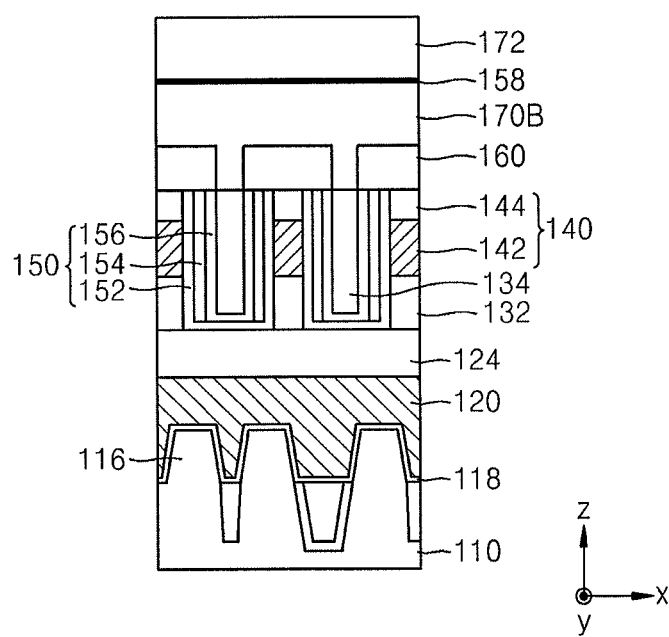
Figure 17C:
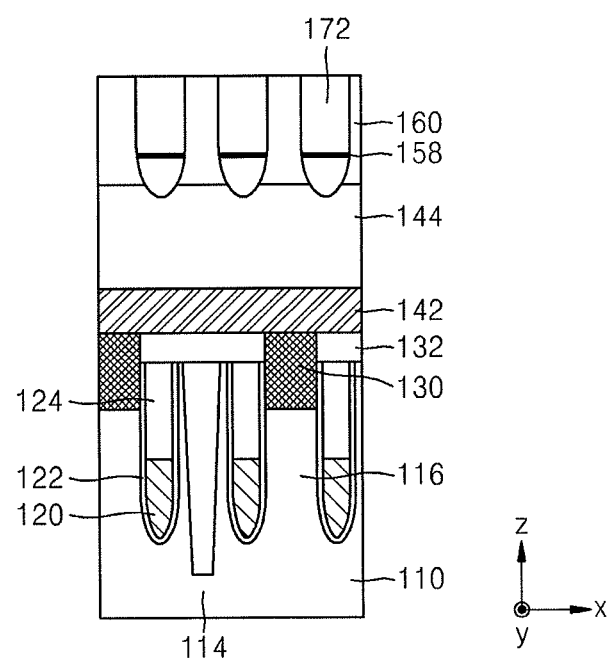
Figure 17D:
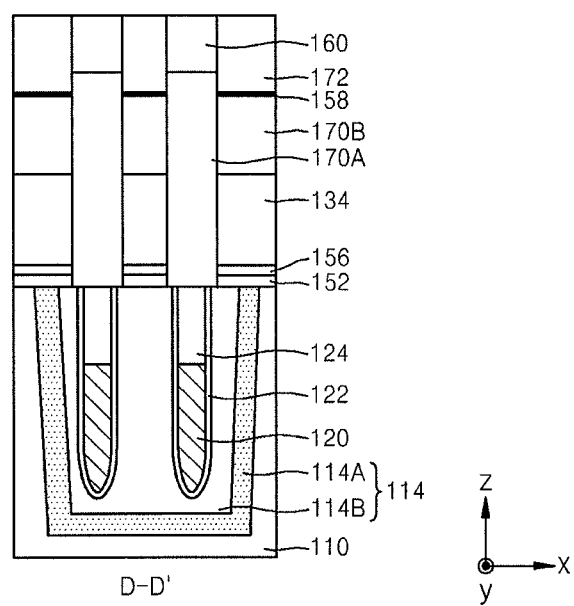

A cell array region of either of the semiconductor devices 100-1 and 100-2 may have a plan layout of FIG. 3. FIGS. 4A, 12A, and 17A are cross-sectional views taken along line A-A' of FIG. 3. FIGS. 4B, 12B, and 17B are cross-sectional views taken along line B-B' of FIG. 3. FIGS. 4C, 12C, and 17C are cross-sectional views taken along line C-C' of FIG. 3. FIGS. 4D, 12D, and 17D are cross-sectional views taken along line D-D' of FIG. 3.

Figure 4E:
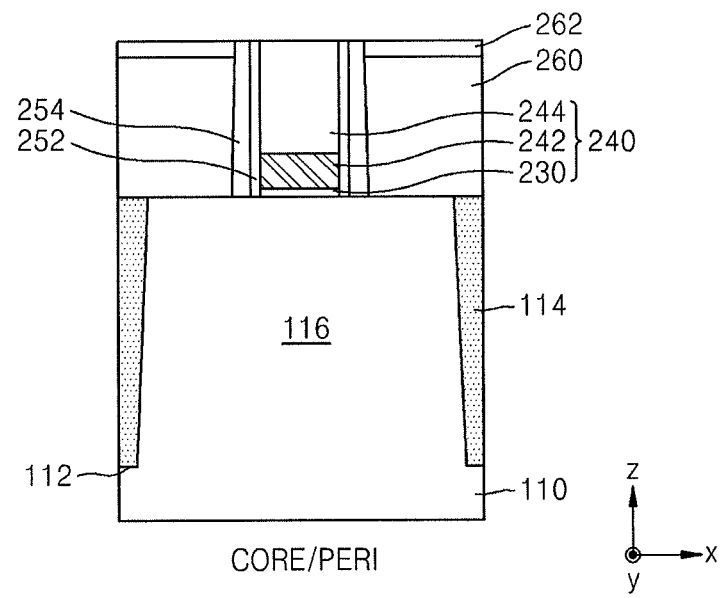

FIG. 4E is a cross-sectional view illustrating some elements in a core region and peripheral region CORE/PERI ("peripheral circuit region") around the cell array region of either of the semiconductor devices 100-1 and 100-2. Also, FIG. 4E illustrates some elements of the core region or peripheral circuit region of either of the semiconductor devices 100-1 and 100-2.

Referring to FIGS. 4A through 4E, a device isolating trench 112 is formed in the substrate 110, and the device isolation film 114 is formed in the device isolating trench 112. The active areas 116 are defined on the substrate 110 by a plurality of the device isolation films 114. The active areas 116 are formed in predetermined (e.g., relatively long island) shapes. When formed in long island shapes, each shape as a short axis and a long axis, for example, like the active areas AC of FIG. 3.

The device isolation film 114 may include a first insulating film 114A and a second insulating film 114B. The first insulating film 114A and the second insulating film 114B may be formed of different materials. For example, the first insulating film 114A may be an oxide film, and the second insulating film 114B may be a nitride film. Also, the device isolation film 114 may have a single-layer structure including one type of insulating film, or a multi-layer structure including at least three types of insulating films.

As shown in FIG. 4B, in order to form a plurality of word line trenches 118 that have bottom surfaces with stepped portions, the device isolation film 114 and the substrate 110 may be etched using different etching processes. The different etching processes may make an etching depth of the device isolation film 114 different from an etching depth of the substrate 110.

A resultant structure including the plurality of word line trenches 118 is washed, and then a gate dielectric film 122, a word line 120, and a buried insulating film 124 are sequentially formed in each of the plurality of word line trenches 118.

After the word line 120 is formed, a source/drain region 116S may be formed on a top surface of the active area 116 by injecting impurity ions into the substrate 110 adjacent to a side surface of the word line trench 118. In another embodiment, before the word line 120 is formed, a process of injecting impurity ions for forming the source/drain region 116S may be performed.

Bottom surfaces of the word lines 120 have uneven shapes, and saddle FINFETs are formed in the active areas 116. In one embodiment, the word lines are formed of at least one of titanium (Ti), TiN, tantalum (Ta), TaN, tungsten (W), WN, TiSiN, or WSiN.

The gate dielectric film 122 may be at least one of a silicon oxide film, a silicon nitride film, a silicon oxynitride film, an oxide/nitride/oxide (ONO) film, or a high-k dielectric film. The high-k dielectric film may have a dielectric constant greater than silicon oxide film. For example, the gate dielectric film 122 may have a dielectric constant ranging from about 10 to about 25.

In one embodiment, the gate dielectric film 122 is formed of at least one of hafnium oxide (HfO), hafnium silicate (HfSiO), hafnium oxynitride (HfON), hafnium silicon oxynitride (HfSiON), lanthanum oxide (LaO), lanthanum aluminum oxide (LaAlO), zirconium oxide (ZrO), zirconium silicate (ZrSiO), zirconium oxynitride (ZrON), zirconium silicon oxynitride (ZrSiON), tantalum oxide (TaO), titanium oxide (TiO), barium strontium titanium oxide (BaSrTiO), barium titanium oxide (BaTiO), strontium titanium oxide (SrTiO), yttrium oxide (YO), aluminum oxide (AlO), or lead scandium tantalum oxide (PbScTaO). The gate dielectric film 122 may be formed, for example, of $HfO_2$, $Al_2O_3$, $HfAlO_3$, $Ta_2O_3$, or $TiO_2$.

The buried insulating film 124 may be a silicon oxide film, a silicon nitride film, a silicon oxynitride film, or a combination thereof.

The insulating film 132 is formed on the substrate 110. The insulating film 132 is formed to a predetermined thickness, e.g., a thickness ranging from about 200 Å to about 400 Å. The insulating pattern 132 may include silicon oxide or another insulating material. Examples include tetraethyl orthosilicate (TEOS), high density plasma (HDP), and orborophosphosilicate glass (BPSG). The insulating film 132 may include a plurality of openings 132H that pass through the insulating film 132 and expose a plurality of the source regions 116S may be formed as shown in FIG. 4C.

Next, a plurality of direct contacts 130, electrically connected to the source regions 116S of the active areas 116, are formed by filling a conductive material in the openings 132H formed in the insulating film 132.

The conductive line structures 140 are formed to extend over the insulating film 132 and the direct contacts 130 in parallel to one another. The conductive line structures 140 include the conductive lines 142 and the insulating capping lines 144 that respectively cover top surfaces of the plurality of conductive lines 142. The conductive lines 142 are electrically connected to the source regions 116S of the active areas 116 of the substrate 110, by being connected to the direct contacts 130.

In one embodiment, the conductive lines 142 include at least one of a semiconductor, a metal, conductive metal nitride, or metal silicide doped with impurities. In another embodiment, the conductive lines 142 may have a multi-layer structure, for example, by sequentially stacking a first metal silicide film, a conductive barrier film, a second metal silicide film, and an electrode layer formed of a metal or metal nitride. For example, the conductive lines 142 may have a stacked structure in which doped polysilicon, TiN, and tungsten (W) are sequentially stacked.

The insulating capping lines 144 includes, for example, a silicon nitride film. The thickness of the insulating capping lines 144 may be greater than the thickness of the conductive lines 142.

In order to form the conductive line structures 140, first, a conductive line forming conductive layer and an insulating layer that covers the conductive line forming conductive layer are formed on the insulating film 132. The thickness of the insulating layer may be greater than the thickness of the conductive line forming conductive layer. The insulating capping lines 144 are formed by patterning the insulating layer. Then, the conductive lines 142 are formed by etching the conductive line forming conductive layer using the insulating capping lines 144 as an etching mask.

Side surfaces of the conductive line structures 140 are covered by the insulating spacer structure 150. The insulating spacer structure 150 may include the first insulating spacer 152, the second insulating spacer 154, and the third insulating spacer 156. The insulating spacer structure 150 may include a silicon oxide film, a silicon nitride film, air, or a combination thereof.

In one embodiment, the second insulating spacer 154, which is surrounded by the first insulating spacer 152 and the third insulating spacer 156 in the insulating spacer structure 150, may be a sacrificial insulating film that is selectively removed. The second insulating spacer 154 may be, for example, an air spacer, e.g., a space filled with air. The insulating spacer structure 150 may include a silicon oxide film, a silicon nitride film, air, or a combination thereof. Although the insulating spacer structure 150 has a three-layer structure in one embodiment, the insulating spacer structure 150 may have a single-layer structure or a two-layer structure in other embodiments.

As shown in FIGS. 4B and 4D, a plurality of first insulating patterns 134 are respectively formed in spaces between the plurality of conductive line structures 140 and the insulating spacer structures 150. Each of the first insulating pattern 134 may be formed two conductive line structures 140.

Referring to FIG. 4D, the first insulating pattern 134 may be formed on the first insulating spacer 152 and the third insulating spacer 156. In the present embodiment, the first insulating pattern 134 may include a silicon oxide film, a silicon nitride film, or a combination thereof. As shown in FIGS. 4A and 4D, the first insulating pattern 134 may extend in the Z direction to have predetermined widths in the X and Y directions. The contact hole 170H may be formed by etching the first insulating pattern 134 in the Z direction. Since the contact hole 170H is formed, a top surface of the second insulating film 114B may be exposed through a lowermost surface of the contact hole 170H.

As shown in FIGS. 4A and 4D, the plurality of contact holes 170H that pass through the insulating films 132 are formed to expose the active areas 116 of the substrate 110. Each of the contact holes 170H may be formed in a space between two adjacent conductive line structures 140 from among the plurality of conductive line structures 140 by selectively removing a part of the first insulating pattern 134. The contact hole 170H may form a space defined by the insulating spacer structure 150 that covers a side wall of each of the two adjacent conductive lines 142. The contact hole 170H may be formed by using a process having an etching selectivity that may remove only the first insulating pattern 134, for example, an etch-back process.

In one embodiment, a top surface of the conductive line structure 140 may be formed to have a bullet-like shape that protrudes upward instead of an angled shape. This is because the insulating capping line 144 of the conductive line structure 140 may be manufactured using a deposition process and an etching process. When a subsequent process of forming landing pads is performed, the landing pads may not be separated from each other, which may lead to a bridge phenomenon.

Also, a material (e.g., TiN) of the lower capacitor electrode 180 may penetrate into the second insulating spacer 154 (e.g., an air spacer) during a process of forming the lower capacitor electrode. Under these circumstances, the failure rate of a process of manufacturing the landing pads may be increased, thereby reducing overall yield.

As shown in FIG. 4E, a gate structure 240 may be formed in the peripheral region CORE/PERI. The gate structure 240 may have a stacked structure formed which includes, for example, the same material from which the conductive line structures 140 are formed. The gate structure 240 includes a gate insulating film 230, a gate electrode 242, and an insulating capping layer 244 that covers a top surface of the gate electrode 242. The gate electrode 242 and the conductive lines 142 may be formed, for example, of a same material.

Side walls of the gate structure 240 are covered by a peripheral circuit region insulating spacer structure 250. The peripheral circuit region insulating spacer structure 250 may include a first insulating spacer 252, a second insulating spacer 254, and a third insulating spacer 256. The peripheral circuit region insulating spacer structure 250 is formed of an insulating material which includes, for example, a silicon oxide film, a silicon nitride film, air, or a combination thereof. Although the second insulating spacer 254 in the peripheral circuit region insulating spacer structure 250 is an air spacer in FIG. 4E, the second insulating spacer 254 may be formed to have a single-layer structure, a two-layer structure, or a three-layer structure including a silicon oxide film or a silicon nitride film in other embodiments.

An interlayer insulating film 260, that is planarized, is formed around the gate structure 240. The interlayer insulating film 260 may be an oxide film, a nitride film, or a combination thereof. In one embodiment, the interlayer insulating film 260 includes an etching stop film 262 having an exposed top surface. The etching stop film 262 may be used as an etching stop layer during an etching process for forming, for example, a second insulating pattern space 160E which will be explained below with reference to FIG. 6. The etching stop film 262 may include, for example, a silicon nitride film. In another embodiment, the etching stop film 262 may be omitted or another etching mask may be used.

Figure 5:
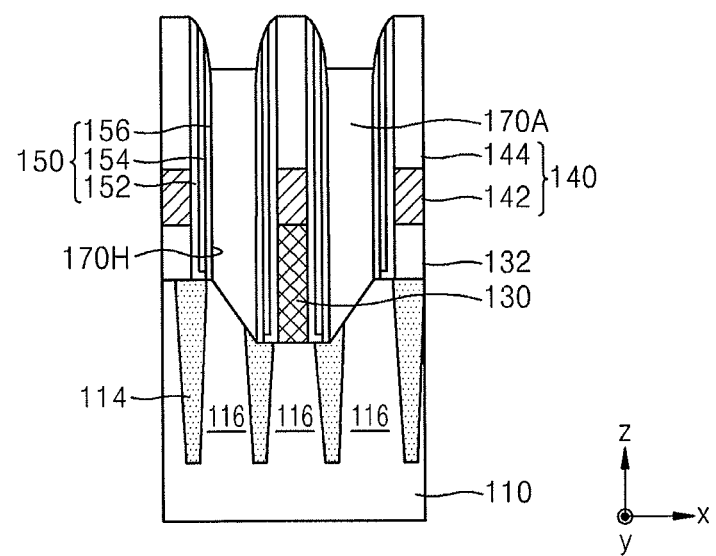

Referring to FIG. 5, in a cell array region, the contact forming conductive layer 170A is filled in the contact hole 170H. The contact hole 170H is formed in a space (see FIGS. 4A and 4D) between one pair of insulating spacer structures 150 formed on respective side surfaces of adjacent conductive line structures 140. The contact forming conductive layer 170A may be filled, for example, using chemical vapor deposition (CVD), physical vapor deposition (PVD), or silicon epitaxial growth. The contact forming conductive layer 170A may be formed of doped polysilicon. The contact forming conductive layer 170A is connected to the active area 116 of the substrate 110 to form the contact plug 170 in a subsequent process.

After the contact forming conductive layer 170A is formed, a stepped portion is reduced by selectively etching only the contact forming conductive layer 170A using a CVD process and/or an etch-back process having an etching selectivity. Because an upper portion of the conductive line structure 140 includes the insulating capping line 144, the height of the insulating capping line 144 may be maintained when an etching process having an etching selectivity that does not etch an insulating layer and etches only a conductive layer is performed.

Figure 6:
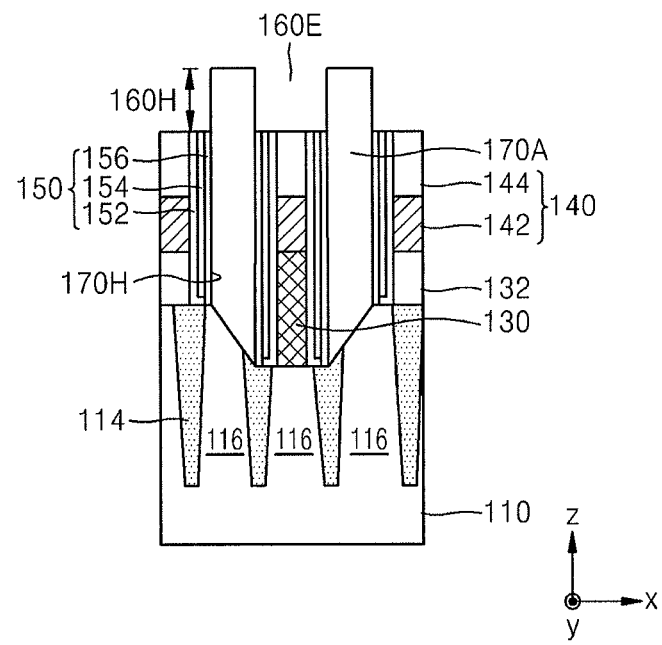

Referring to FIG. 6, a top surface may be formed parallel to the plane that extends from the main surface of the substrate 110. This may be accomplished by removing an upper portion of each of the conductive line structures 140. Because a process of etching only a cell array region may be used, the peripheral circuit region of FIG. 4E may not be etched using the etching stop film 262 or a separate mask. A cell open photo may be used instead of the etching stop film 262 in FIG. 6. Due to the etching process, part of the top surface of the insulating spacer structure 150 may be exposed. The top surface of the insulating capping line 144 may be parallel to the plane that extends from the main surface of the substrate 110.

The etching process may be a process having an etching selectivity that does not etch a conductive material and etches only an insulating material. In FIG. 6, a wet etching process, a dry etching process, or an etch-back process may be used. The second insulating pattern space 160E is formed between upper portions of adjacent contact forming conductive layers 170A, by removing parts of top surfaces of the insulating capping line 144 and the insulating spacer structure 150 using the etching process. A predetermined stepped portion 160H may be formed between top surfaces of the conductive line structure 140 and the insulating spacer structure 150 and a top surface of the contact forming conductive layer 170A that is not removed due to the etching selectivity.

Figure 7:
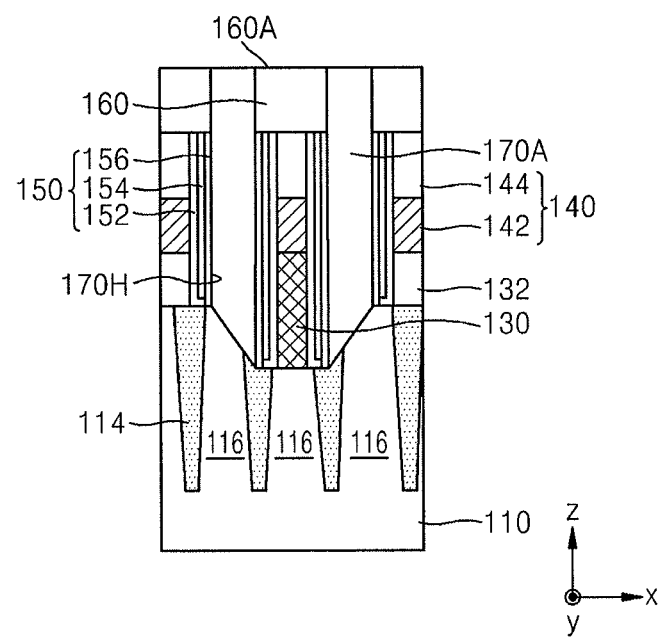

Referring to FIG. 7, the second insulating pattern 160 is formed to fill the entire second insulating pattern space 160E described with reference to FIG. 6 and to cover a top surface of the contact forming conductive layer 170A. A material of the second insulating pattern 160 may include a silicon oxide film, a silicon nitride film, or a combination thereof. The second insulating pattern 160 may include a silicon nitride film in FIG. 7. The second insulating pattern 160 may be formed using, for example, CVD or PVD.

After the material of the second insulating pattern 160 is formed to cover the entire contact forming conductive layer 170A, a process of planarizing the top surface of the material of the second insulating pattern 160 is performed. This process may include removing a part of the material of the second insulating pattern 160 until the contact forming conductive layer 170A is exposed. The etching process may be, for example, a CMP process or an etch-back process that does not etch a conductive material and etches only an insulating material. This process may be performed to prevent a surface from being round when CVD or PVD is used to form the second insulating pattern 160.

Because the second insulating pattern 160 is formed using the aforementioned method, and because the top surface 160A of the second insulating pattern 160 is parallel to the plane that extends from the main surface of the substrate 110, a bridge phenomenon in which landing pads are not separated may be prevented in a subsequent process of forming the landing pads. Also, a lower capacitor electrode forming material may be prevented from penetrating into an air spacer when the lower capacitor electrode 180 is formed.

Figure 8:
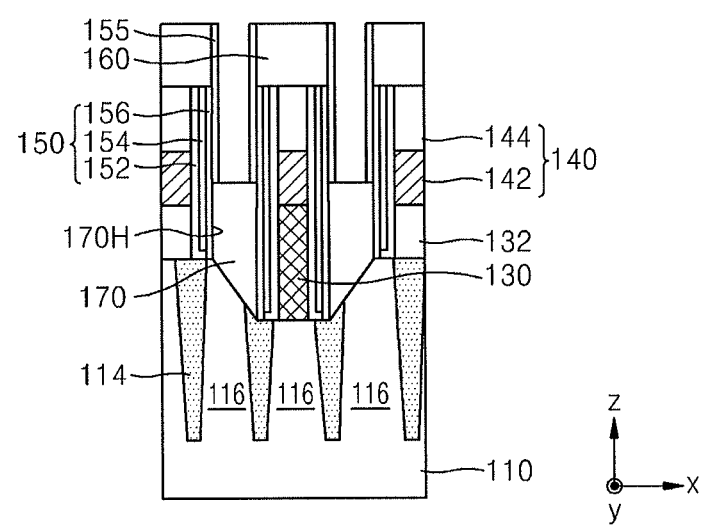

Referring to FIG. 8, the contact plug 170 is formed by selectively removing part of the contact forming conductive layer 170A that is formed in FIG. 7 using an etching process having a predetermined etching selectivity. This removal process may reduce a size of a stepped portion. Also, this process may subsequently allow electrically connect to be established between the active area 116 of the substrate 110 and the lower capacitor electrode 180 through a landing pad. Accordingly, a bridge phenomenon may be prevented, which otherwise may have occurred when the landing pad is connected without reducing a height of the contact forming conductive layer 170A.

After the contact plug 170 is formed, a landing pad spacer 155 may be formed on a side wall of the insulating spacer structure 150 and a side wall of the second insulating pattern 160. The landing pad spacer 155 may define a width of the landing pad when the landing pad is formed. In another embodiment, a process of forming the landing pad spacer 155 may be omitted.

Figure 9:
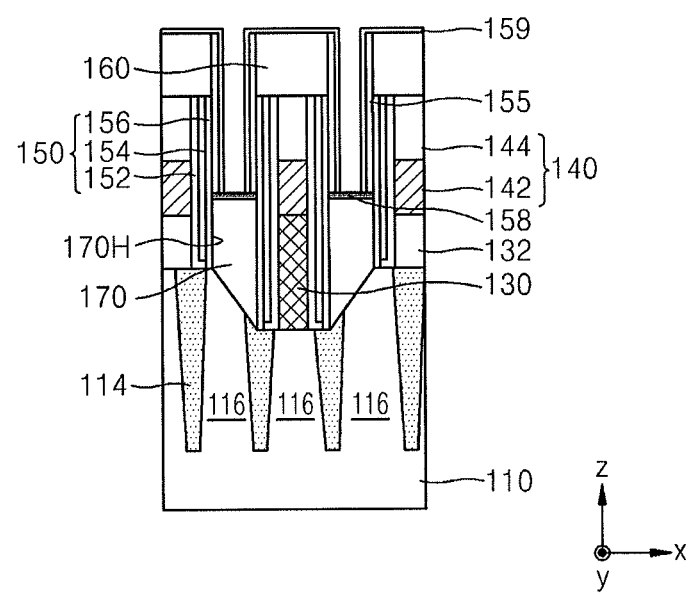

Referring to FIG. 9, the metal silicide film 158 may be formed on an exposed top surface of the contact plug 170. The metal silicide film 158 may include at least one of cobalt silicide ($CoSi_x$), nickel silicide ($NiSi_x$), manganese silicide ($MnSi_x$), or another material. For illustrative purposes, in FIG. 9, the metal silicide film 158 is formed of cobalt silicide ($CoSi_x$).

The following processes may be performed to form the metal silicide film 158. First, a metal layer is deposited on the exposed top surface of each of the contact plugs 170, and then is silicidated by performing a first rapid thermal processing (RTP) process. The first RTP process may be performed, for example, at a temperature ranging from about 450° C. to about 550° C. In the first RTP process, the metal layer that does not react with silicon (Si) atoms is removed, and then the metal silicide film 158 is formed by performing a second RTP process at a temperature ranging from, for example, about 800° C. to about 950° C., which is higher than the temperature of the first RTP process. In one embodiment, a cobalt (Co) layer may be formed as the metal layer, and the metal silicide film 158 including cobalt silicide may be formed. In another embodiment, a process of forming the metal silicide film 158 may be omitted.

After the metal silicide film 158 is formed, a barrier film 159 that covers a side surface of the second insulating pattern 160 and a side surface of the landing pad spacer 155 may be formed. The barrier film 159 may be selectively formed on a top surface of the metal silicide film 158. The barrier film 159 may be formed to have, for example, a Ti/TiN stacked structure.

Figure 10:
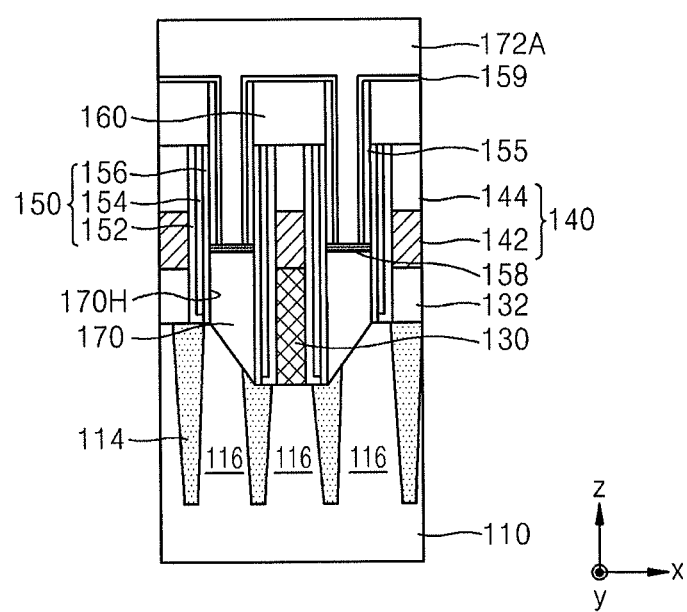

Referring to FIG. 10, a landing pad forming material 172A is formed to fill a space defined by the barrier film 159. The landing pad forming material 172A may be formed using a method such as CVD or PVD. The landing pad forming material 172A may be a conductive material such as a metal, a metal compound, or polysilicon. In the embodiment of FIG. 10, the landing pad forming material 172A includes tungsten (W).

The landing pad forming material 172A may be formed to fill a space defined by the metal silicide film 158 and the barrier film 159, and to cover the entire conductive line structure 140 and the entire second insulating pattern 160. The landing pad forming material 172A is physically or electrically connected to the contact plug 170 through the metal silicide film 158. The contact plug 170 is electrically connected to the active area 116 of the substrate 110, to be electrically connected to a lower capacitor electrode in a subsequent process.

Figure 11:
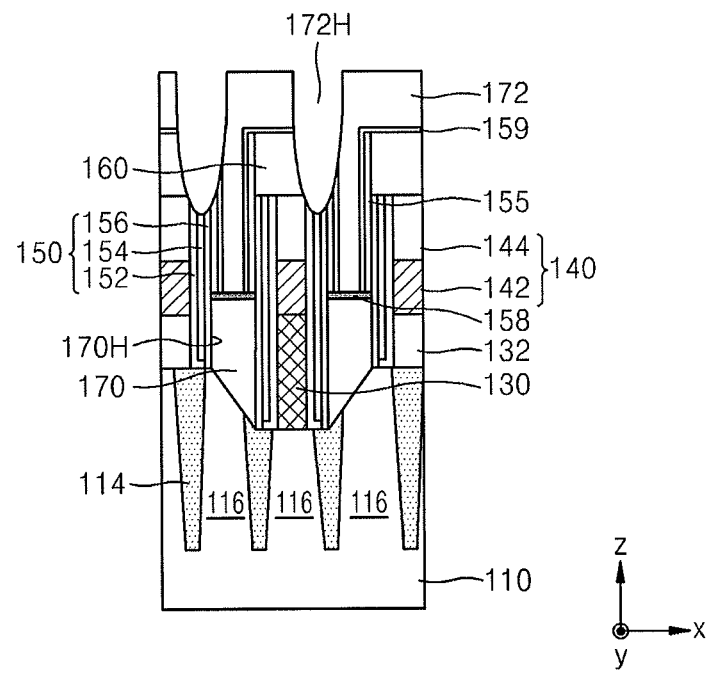

Referring to FIG. 11, the landing pad hole 172H may be formed, by removing part of the landing pad 172 and part of a side portion of the second insulating pattern 160, to expose the insulating spacer structure 150. Because the landing pad hole 172H is formed by removing part of the side portion of the second insulating pattern 160 and part of an upper portion of the insulating spacer structure 150, the landing pads 172 may be separated to prevent a bridge phenomenon from occurring.

Because a top surface of the insulating spacer structure 150 is exposed when the landing pad hole 172H is formed, an empty space may be formed by selectively removing the second insulating spacer 154 that is an innermost insulating spacer in a three-layer structure of the insulating spacer structure 150 exposed through the landing pad hole 172H. The second insulating spacer 154 may be removed using, for example, a wet etching method having an etching selectivity. An air spacer may be formed by a method which uses the second insulating spacer 154 as a sacrificial insulating film.

The air spacer may extend in a longitudinal direction of the conductive line structures 140. Because the air spacer is formed between the conductive lines 142 and the contact plugs 170 in a limited space of the semiconductor device that is highly downscaled and highly integrated, a relative permittivity between the conductive lines 142 and the contact plugs 170 may be reduced. As a result, the capacitance between adjacent conductive lines 142, or between the conductive line 142 and the contact plug 170, may be reduced.

Referring to FIGS. 12A through 12D, the third insulating pattern 162 may be formed by filling an insulating material in the landing pad hole 172H. The third insulating pattern 162 may be formed to contact top and side surfaces of the second insulting pattern 160 (see FIG. 12B) and to contact a top surface of the first insulating pattern 134 (see FIG. 12D). Also, the third insulating pattern 162 may contact a part of the insulating capping line 144 (see FIGS. 12A and 12C). The insulating material that is filled in the landing pad hole 172H may be a silicon oxide film, a silicon nitride film, or a combination thereof. FIGS. 12A through 12D are cross-sectional views for explaining a method of manufacturing the semiconductor device 100-1, according to an embodiment. FIGS. 12A through 12D illustrate the semiconductor device 100-1 further including elements, that is, the metal silicide film 158, the barrier film 159, the second insulating pattern 160, the third insulating pattern 162, the contact plug 170, and the landing pad 172, formed by using the method of FIGS. 5 through 11 in addition to elements of FIGS. 4A through 4D. The same elements as those in FIGS. 4A through 4D and FIGS. 5 through 11 will not be repeatedly explained in FIGS. 12A through 12D.

Referring to FIG. 12B, the second insulating pattern 160 may be formed to contact top surfaces of the plurality of conductive line structures 140. The third insulating pattern 162 may be formed to contact a top surface of the second insulating pattern 160 and may extend to a space defined by two adjacent second insulating patterns 160 to contact a top surface of the first insulating pattern 134. Referring to FIG. 12C, the third insulating pattern 162 may contact a top surface of the insulating capping line 144, and may be formed so that levels of uppermost ends of the insulating capping line 144 are different from one another due to the third insulating pattern 162. Referring to FIGS. 12C and 12D, the landing pad 172 may be formed on the contact plug 170, and the first insulating pattern 134 and the third insulating pattern 162 may be disposed between two adjacent landing pads 172. The metal silicide film 158 that is formed in the direction parallel to the main surface of the substrate 110 may be disposed between the landing pad 172 and the contact plug 170.

In the semiconductor device of FIGS. 12A through 12D, a contact structure for electrically connecting the active area 116 of the substrate 110 and the lower capacitor electrode 180 includes the contact plug 170 that is connected to the active area 116, and the landing pad 172 that is formed to be connected to the contact plug 170, to vertically overlap the conductive line 142 and to cover the second insulating pattern 160 on the conductive line structure 140. The metal silicide film 158 and the barrier film 159 may be formed between the contact plug 170 and the landing pad 172. The lower capacitor electrode 180 of FIG. 1 is connected to the landing pad 172. Next, a capacitor may be formed by sequentially forming a capacitor insulating film and a capacitor upper electrode on the capacitor lower electrode 180, and connecting the capacitor insulating film and the capacitor upper electrode.

A part of the barrier film 159 is cut in a process of manufacturing the landing pad hole 172H. In this case, when the second insulating pattern 160 is omitted, that is, when the insulating capping line 144 of the conductive line structure 140 is not etched and the second insulating pattern 1620 is not formed to be parallel to the plane that extends from the main surface of the substrate 110, a top surface of the conductive line structure 140 may be formed to have a shape that protrudes in a third direction (Z direction) or a bullet-like shape that protrudes in the third direction (Z direction) and thus the barrier film 159 may not be cut and thus a bridge phenomenon may occur between the landing pads 172.

Since the top surfaces of the conductive line structures 140 are parallel to the main surface of the substrate 110 and the second insulating pattern 160 is formed to have parallel top and bottom surfaces, a bridge phenomenon in the landing pad 172 may be prevented (see FIG. 12A). Since the third insulating pattern 162 is formed to contact top surfaces of the conductive line structures 140 and to cover the top of the insulating spacer structure 150, when the second insulating spacer 154 is an air spacer, a material of the capacitor lower electrode 180 may be prevented from penetrating into the air spacer (see FIG. 12A).

FIGS. 13 through 17D illustrate operations performed during an embodiment of a method for manufacturing the semiconductor device 100-2 of FIGS. 2 and 17A. The method is performed after the description of FIGS. 5 and 6, following the description of FIGS. 4A through 4E.

Figure 13:
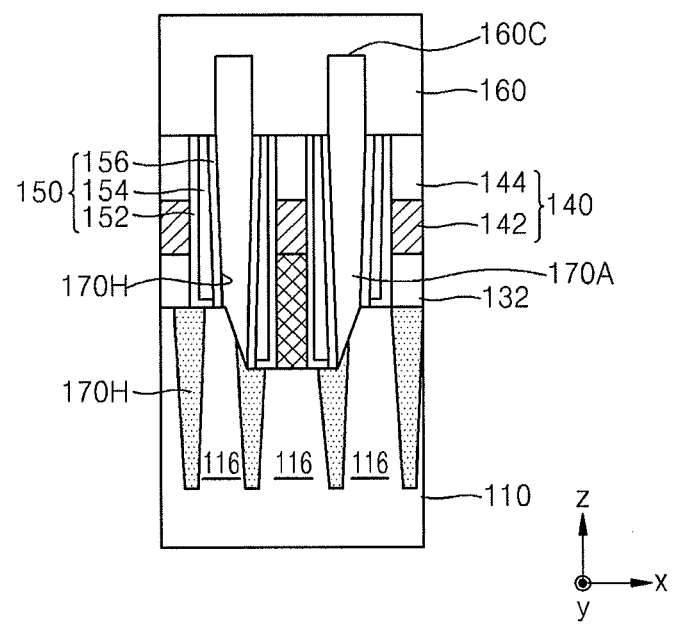
FIGS. 13 through 17D illustrate an embodiment of a method for manufacturing the semiconductor device of FIG. 2.

Referring to FIG. 13, the second insulating pattern 160 is formed on and to cover the insulating capping line 144 that is etched to be parallel to the plane that extends from the main surface of the substrate 110, a top surface of the insulating spacer structure 150, and the contact forming conductive layer 170A. The second insulating pattern 160 may be formed of silicon oxide, silicon nitride, or a combination thereof. The second insulating pattern 160 may be formed by using a method such as CVD or PVD.

An air spacer is formed by etching and removing an inside portion of the second insulating spacer 154 using the second insulating spacer 154 as a sacrificial insulating film. The top of the air spacer is then closed by filling the second insulating pattern 160. As a result, a material of the lower capacitor electrode 180 may be prevented from penetrating into the air spacer, during a subsequent process of filling the lower capacitor electrode 180.

Figure 14:
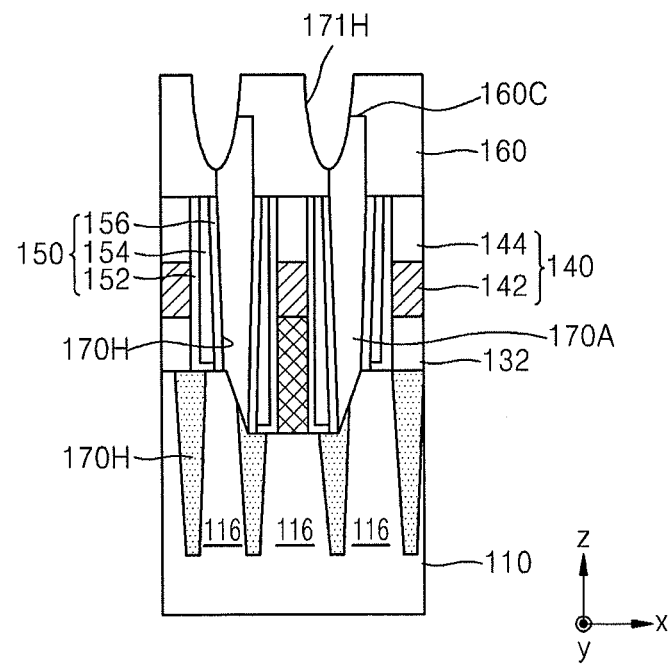

Referring to FIG. 14, the contact landing pad hole 171H is formed in the second insulating pattern 160. The contact landing pad hole 171H may provide a space by etching part of the second insulating pattern 160. This space is different from a space formed in the second insulating pattern 160 and the insulating spacer structure 150 of FIG. 11. As will be described in detail according to a subsequent process, because the contact landing pad hole 171H is formed only in the second insulating pattern 160 as shown in FIG. 14, a landing pad neck phenomenon may be prevented.

Figure 15:
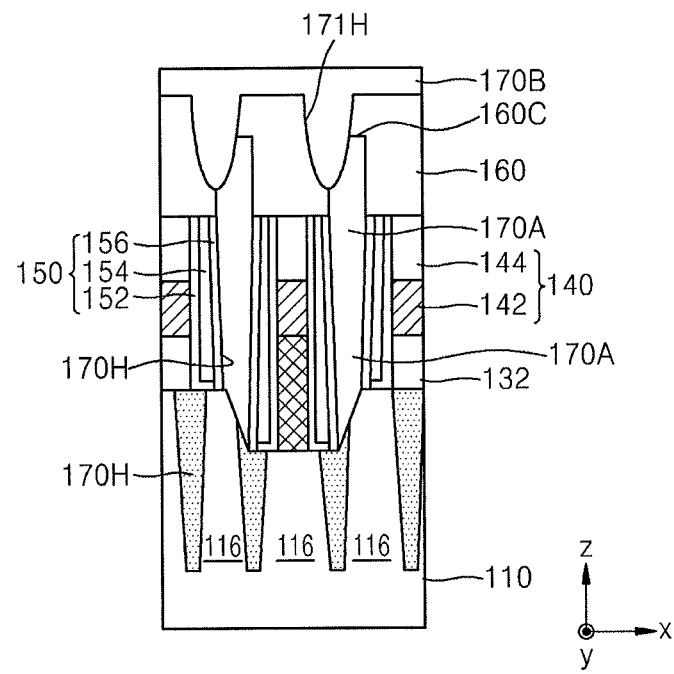

Referring to FIG. 15, the landing pad forming conductive layer 170B is formed to fill the contact landing pad hole 171H and to cover a top surface of the second insulating pattern 160. The landing pad forming conductive layer 170B may be formed using a method such as CVD or PVD. The landing pad forming conductive layer 170B may be formed of a conductive material such as doped polysilicon.

The landing pad forming conductive layer 170B may be connected to the contact forming conductive layer 170A between the one pair of conductive line structures 140. This may be accomplished by being integrated with the contact forming conductive layer 170A. The landing pad forming conductive layer 170B and the contact forming conductive layer 170A may be formed, for example, of the same material.

Figure 16:
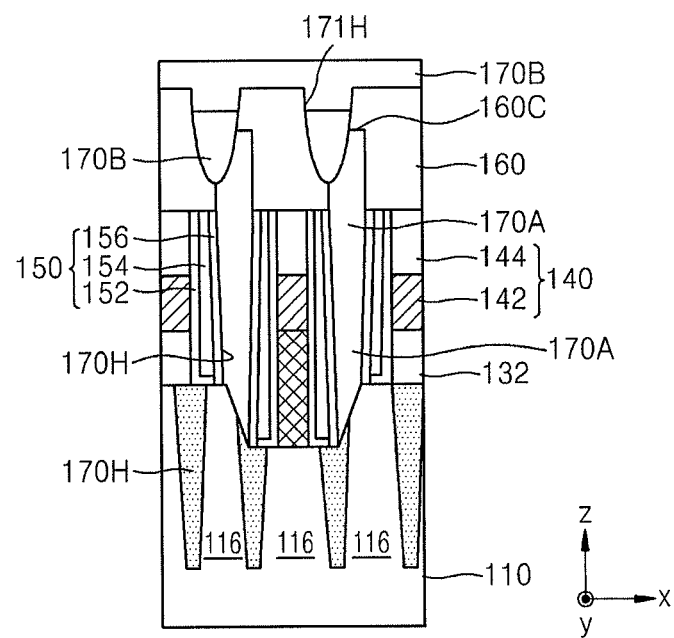

Referring to FIG. 16, a process of reducing a stepped portion of the landing pad forming conductive layer 170B is performed. In the present embodiment, a height of an uppermost end of the landing pad forming conductive layer 170B may be lower than a height of an uppermost end of the second insulating pattern 160. This is to prevent a bridge phenomenon because when the landing pads 172 are formed without reducing the height of the uppermost end of the landing pad forming conductive layer 170B to be lower than the height of the uppermost end of the insulating pattern 160, the landing pads 172 may not be efficiently separated, thereby leading to a bridge phenomenon. The height of the uppermost end of the landing pad forming conductive layer 170B may be higher than a height 160C of a contact portion between the contact forming conductive layer 170A and the second insulating pattern 160 in the X direction.

In order to reduce the stepped portion of the landing pad forming conductive layer 170B, an etching method having an predetermined etching selectivity (e.g., one that may etch only a conductive material and may maintain an insulating material) may be used. As long as the etching method has the etching selectivity, the stepped portion of the landing pad forming conductive layer 170B may be reduced to a level lower than the height 160C. This may be accomplished by removing only part of the landing pad forming conductive layer 170B using, for example, a CMP process or an etch-back process.

Referring to FIGS. 17A and 17B, the landing pad 172 is formed by forming the metal silicide film 158 on a top surface of the landing pad forming conductive layer 170B that has a reduced stepped portion due to the etching process, forming the barrier film 159 to fill both side surfaces of the contact landing pad hole 171H, and then filling a conductive material in a remaining space of the contact landing pad hole 171H that is defined by the metal silicide film 158 and the barrier film 159. Referring to FIGS. 17C and 17D, the second insulating pattern 160 may be disposed between two adjacent landing pads 172.

The metal silicide film 158 may include, for example, at least one of cobalt silicide ($CoSi_x$), nickel silicide ($NiSi_x$), and manganese silicide ($MnSi_x$). In FIGS. 17A through 17D, the metal silicide film 158 may be formed of cobalt silicide ($CoSi_x$) or another material. For example, the metal silicide film 158 may be formed of various types of metal silicide materials. A method for forming the metal silicide film 158, for example, may be the same as that described with reference to FIG. 9.

After the metal silicide film 158 is formed, the barrier film 159 may be formed to cover an inner side surface of the contact landing pad hole 171H. The barrier film 159 may also be selectively formed on a top surface of the metal silicide film 158. The barrier film 159 may be formed to have a Ti/TiN stacked structure.

The landing pad 172 is formed in the remaining spacer of the contact landing pad hole 171H defined by the barrier film 159 and the metal silicide film 158. The landing pad 172 may be formed, for example, by filling a conductive material using a method such as CVD or PVD. The landing pad 172 may be formed of a conductive material such as a metal, a metal compound, or doped polysilicon. For illustrative purposes, the landing pad 172 is formed of tungsten (W) in FIGS. 17A through 17d.

The landing pad 172 may be physically or electrically connected to the landing pad forming conductive layer 170B through the metal silicide film 158. The landing pad forming conductive layer 170B may be connected to the active area 116 of the substrate 110, for example, by being integrated with the contact forming conductive layer 170A which is to be electrically connected to the lower capacitor electrode 180 of FIG. 2 in a subsequent process.

As described above, because the insulating capping line 144 of the conductive line structure 140 is planarized using an etching process as is evident from in FIGS. 17A through 17D, because an air spacer is formed using the second insulating spacer 154 as a sacrificial insulating film, and because the top of the air spacer is closed using the second insulating spacer 154, a material of the lower capacitor lower electrode 180 may be prevented from penetrating into the air spacer in a subsequent process for forming the lower capacitor electrode 180. Also, because the second insulating pattern 160 is formed and landing pads are formed by defining a space of the contact landing pad hole 171H therein, a bridge phenomenon may be prevented which otherwise may have occurred in a subsequent process of forming the landing pads.

Also, referring to FIG. 17A, because the contact forming conductive layer 170A and the landing pad forming conductive layer 170B are integrally connected, and because the landing pad 172 is disposed on a top surface of the landing pad forming conductive layer 170B, the contact forming conductive layer 170A, the landing pad forming conductive layer 170B, and the landing pad 172 may form a contact structure 170S. In the contact structure 170S, a space between the contact forming conductive layer 170A and the landing pad 172 may have the width W3. Because the contact structure 170S has the width W3, a landing pad neck phenomenon may be prevented which otherwise may have occurred due to a lack of margin in the manufacturing process.

Figure 18:
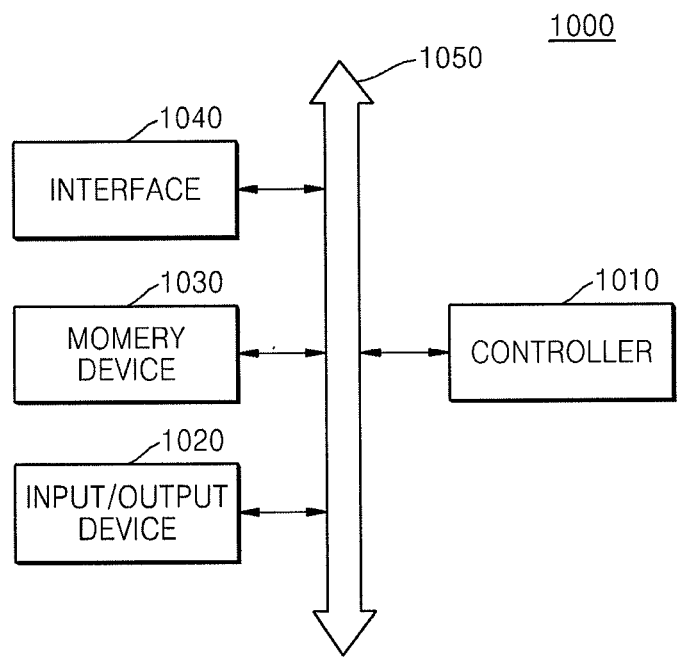
FIG. 18 illustrates an embodiment of a system which includes a semiconductor device.

FIG. 18 illustrates a system 1000 including a semiconductor device according to any of the aforementioned embodiments. The system 1000 includes a controller 1010, an input/output device 1020, a memory device 1030, and an interface 1040. The system 1000 may be, for example, a mobile system or any other system that transmits and/or receives information. Examples of the mobile system include a personal digital assistant (PDA), a portable computer, a web tablet, a wireless phone, a mobile phone, a digital music player, and a memory card.

Examples of the controller 1010 for controlling an execution program in the system 1000 may include a microprocessor, a digital signal processor, and a microcontroller.

The input/output device 1020 is used to input or output data to or from the system 1000. The system 1000 may be connected to an external device such as a personal computer or a network, using the input/output device 1020, and may exchange data with the external device. Examples of the input/output device 1020 may include a keypad, a keyboard, and a display device.

The memory device 1030 may store code and/or data for operating the controller 1010, and/or may store data processed by the controller 1010. The memory device 1030 includes a semiconductor device including a fin TFT. For example, the memory device 1030 may include at least one of the semiconductor devices 100-1 or 100-2 of FIGS. 1 and 2.

The interface 1040 may be a data transmission path between the system 1000 and an external device. The controller 1010, the input/output device 1020, the memory device 1030, and the interface 1040 may communicate with one another via a bus 1050. The system 1000 may be or be used in or with a mobile phone, an MP3 player, a navigation system, a portable multimedia player (PMP), a solid-state disk (SSD), or a household appliance.

Figure 19:
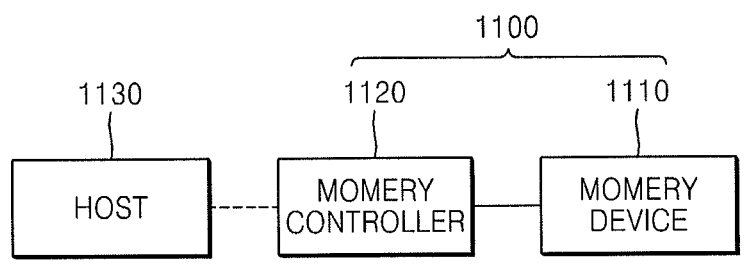
FIG. 19 illustrates an embodiment of a memory card which includes a semiconductor device.

FIG. 19 is an embodiment of a memory card 1100 including any of the aforementioned embodiments of a semiconductor device. The memory card 1100 includes a memory device 1110 and a memory controller 1120. The memory device 1110 may store data. The memory device 1110 may have, for example, nonvolatile characteristics and thus may retain stored data even when not powered. The memory device 1110 may include at least one of the semiconductor devices 100-1 or 100-2 of FIGS. 1 and 2.

The memory controller 1120 may read data stored in the memory device 1110, and/or may store data in the memory device 1110, in response to a read/write request. The memory controller 1120 may include at least one of the semiconductor devices 100-1 or 100-2 of FIGS. 1 and 2.

In accordance with one or more embodiments, a semiconductor device is provided that prevents a bridge phenomenon from occurring between landing pads. Each of the landing pads may connect the lower electrode of a capacitor to an active area of a substrate through a contact plug having a reduced cross-sectional area, in a semiconductor device having a small unit cell size due to integration.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, it will be understood by those of skill in the art that various changes in form and details may be made without departing from the spirit and scope of the present invention as set forth in the following claims.

What is claimed is:

1. A semiconductor device comprising:
   a substrate that has an active area;
   a pair of conductive line structures on the substrate and including insulating spacer structures respectively formed on side walls thereof;
   a contact plug between the pair of conductive line structures and connected to the active area;
   a first insulating pattern on the pair of conductive line structures;
   a second insulating pattern to contact a side surface of the first insulating pattern and a top surface of each of the insulating spacer structures; and
   a landing pad connected to the contact plug, formed between the first insulating pattern and the second insulating pattern, and extending to and over the first insulating pattern to vertically overlap one conductive line structure of the pair of conductive line structures.

2. The semiconductor device of claim 1, further comprising:
a capacitor lower electrode on a top surface of the landing pad to be electrically connected to the landing pad.

3. The semiconductor device of claim 1, wherein:
a top surface of the first insulating pattern is substantially parallel to a plane that extends from a main surface of the substrate, and
a bottom surface of the first insulating pattern covering top surfaces of the insulating spacer structure and the pair of conductive line structures in a direction substantially parallel to the plane that extends from the main surface of the substrate.

4. The semiconductor device of claim 1, wherein:
the contact plug between the pair of conductive line structures has a width of a first size in a direction substantially parallel to a plane that extends from a main surface of the substrate;
the landing pad has a width of a second size over the first insulating pattern in the direction parallel to the plane that extends from the main surface of the substrate; and
the second size is greater than the first size.

5. The semiconductor device of claim 1, further comprising:
a metal silicide film between the contact plug and the landing pad.

6. The semiconductor device of claim 1, wherein the first insulating pattern and the second insulating pattern include a same material.

7. The semiconductor device of claim 1, wherein the insulating spacer structure includes an air spacer.

8. The semiconductor device of claim 1, further comprising
a barrier film to surround side walls of the first insulating pattern, the second insulating pattern, and the insulating spacer structure.

9. A semiconductor device, comprising:
an active area;
adjacent conductive lines in a layer over the active area;
an insulating spacer between the conductive lines and defining a contact hole having a first width in a first direction;
a first insulating pattern on the conductive lines and insulating spacer;
a second insulating pattern over the first insulating pattern to define a landing pad hole, the second insulating pattern having a second width different from the first width;
a contact plug in the contact hole and connected to the active area; and
a landing pad in the landing pad hole and connected to the contact plug, wherein the landing pad or the contact plug at least partially overlaps one of the conductive lines along the first direction.

10. The semiconductor device as claimed in claim 9, further comprising:
a capacitor electrode electrically connected to the landing pad.

11. The semiconductor device as claimed in claim 9, wherein the second width is greater than the first width.

* * * * *